United States Patent
Luo et al.

(10) Patent No.: US 8,295,096 B2
(45) Date of Patent: Oct. 23, 2012

(54) METHOD OF PROGRAMMING FLASH MEMORY OF THE DIFFERENTIAL CELL STRUCTURES FOR BETTER ENDURANCE

(75) Inventors: Wenzhe Luo, Shanghai (CN); Paul Ouyang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 316 days.

(21) Appl. No.: 12/794,698

(22) Filed: Jun. 4, 2010

(65) Prior Publication Data

US 2011/0051522 A1     Mar. 3, 2011

(30) Foreign Application Priority Data

Aug. 31, 2009   (CN) .......................... 2009 1 0194918

(51) Int. Cl.
*G11C 16/10*     (2006.01)
*G11C 16/04*     (2006.01)

(52) U.S. Cl. ......... 365/185.21; 365/185.22; 365/185.23; 365/185.28; 365/185.33

(58) Field of Classification Search ................. None
See application file for complete search history.

(56) References Cited

U.S. PATENT DOCUMENTS

| | | | |
|---|---|---|---|
| 5,714,766 A | 2/1998 | Chen et al. | |
| 5,864,499 A * | 1/1999 | Roohparvar et al. | .... 365/185.08 |
| 6,141,256 A | 10/2000 | Forbes | |
| 6,256,216 B1 | 7/2001 | Lien et al. | |
| 7,269,063 B2 * | 9/2007 | Chih | .......................... 365/185.1 |
| 7,272,062 B2 | 9/2007 | Taddeo | |
| 7,420,844 B2 * | 9/2008 | Kato et al. | ............... 365/185.21 |
| 7,804,713 B2 * | 9/2010 | Parker | ....................... 365/185.03 |
| 2003/0081447 A1 | 5/2003 | Hsu et al. | |

OTHER PUBLICATIONS

Office Action for U.S. Appl. No. 12/794,697, mailed on Feb. 16, 2012, 10 pages.

Notice of Allowance for U.S. Appl. No. 12/794,697, mailed on Jul. 31, 2012, 8 pages.

* cited by examiner

*Primary Examiner* — Tan T. Nguyen
(74) *Attorney, Agent, or Firm* — Kilpatrick Townsend & Stockton LLP (57) ABSTRACT

A method of programming a differential flash memory cell having a first and a second memory cell is disclosed. The first memory cell includes a first transistor associated with a first threshold voltage and the second memory cell includes a second transistor associated with a second threshold voltage. The method includes reading the first and second memory cells to determine a current associated with the first and second threshold voltages. The first threshold voltage is equal to a first value and the second threshold voltage is equal to a second value. The method further includes determining if the first current corresponds to a predetermined logic state. If the current does not correspond to the predetermined logic state, the first and second memory cells are programmed. The programming includes changing the first threshold voltage from the first value to a third value and the second threshold voltage from the second value to a fourth value.

20 Claims, 6 Drawing Sheets

METHOD OF PROGRAMMING FLASH MEMORY OF THE DIFFERENTIAL CELL STRUCTURES FOR BETTER ENDURANCE

CROSS-REFERENCES TO RELATED APPLICATIONS

This application claims priority to Chinese Patent Application No. 200910194918.3, filed Aug. 31, 2009, entitled "Method of Improving Cell Endurance in a Differential Flash Memory Design," by Inventors Wenzhe Luo and Paul Ouyang, commonly assigned, incorporated by reference herein for all purposes.

The following commonly-owned co-pending application is being filed concurrently and is hereby incorporated by reference in its entirety for all purposes:

U.S. patent application Ser. No. 12/794,697, in the name of Wenzhe Luo and Paul Ouyang, titled, "Method of Flash Memory Design With Differential Cell For Better Endurance."

BACKGROUND OF THE INVENTION

The present invention is directed to integrated circuits and their processing for the manufacture of semiconductor devices. More particularly, the invention provides a flash memory device and method using a differential cell design. But it would be recognized that the invention has a much broader range of applicability. For example, the invention can be applied to EEPROMs or other types of memory storage.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence of absence of charge on the floating gate. The charge is generally sufficient to prevent conduction even when a normal high signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E2 PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Various types of Flash cells have been proposed and utilized by the semiconductor industry. As merely an example, a split gate type structure includes a floating gate and a control gate, which has a split type structure. Such split gate structure has been used by companies such as Silicon Storage Technology, Inc. Unfortunately, certain limitations exist with such a split gate type cell structure. For example, such a cell structure may be difficult to shrink beyond a certain critical dimension such as 0.25 micron and below. These and other limitations of the conventional split gate cell have been described throughout the present specification and more particularly below.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a flash memory device and method using a differential cell design. But it would be recognized that the invention has a much broader range of applicability. For example, the invention can be applied to EEPROMs or other types of memory storage.

In a specific embodiment of the present invention, a method of programming a differential flash memory cell including a first memory cell and a second memory cell is provided. The first memory cell includes a first transistor associated with a first threshold voltage and the second memory cell includes a second transistor associated with a second threshold voltage. The method includes reading the first memory cell and the second memory cell to determine a first current associated with at least the first threshold voltage and the second threshold voltage. The first threshold voltage is equal to a first value and the second threshold voltage is equal to a second value. The method further includes determining if the first current corresponds to a predetermined logic state. If the first current does not correspond to the predetermined logic state, the first memory cell and the second memory cell are programmed. The programming includes changing the first threshold voltage from the first value to a third value. The programming further includes changing the second threshold voltage from the second value to a fourth value. The programming additionally includes reading the first memory cell and the second memory cell to determine a second current associated with at least the first threshold voltage and the second threshold voltage. The programming also includes determining whether the second current satisfies a predetermined relation with respect to a predetermined current. If the second current does not satisfy the predetermined relation with respect to the predetermined current the second threshold voltage is changed from a fourth value to a fifth value.

In another specific embodiment of the present invention, a flash memory system is provided. The flash memory system includes a first memory cell and a second flash memory cell. The flash memory system additionally includes a comparator configured to receive a first current from the first flash memory cell. The comparator is also configured to receive a second current from the second flash memory cell and process information associated with the first current and the second current. Furthermore, the comparator is configured to determine a differential current equal to a difference between the first current and the second current. The flash memory system further includes a current supply configured to provide a predetermined current. The flash memory system also includes a detector configured to determine a relation between the differential current and the predetermined current.

Many benefits are achieved by way of the present invention over conventional techniques. For example, the present technique provides an easy to use process that relies upon conventional technology. In some embodiments, a differential flash memory design and method of use are described that provide improved endurance in terms of P/E cycles. This can improve the device reliability and performance of the semiconductor circuit being formed by allowing it to function for extended periods of time without failure. A method of altering the read voltage applied within the differential cell design is provided that can be optimized for fast readback or low power savings. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a flash memory device and method using a differential cell design. But it would be recognized that the invention has a much broader range of applicability. For example, the invention can be applied to EEPROMs or other types of memory storage.

Flash memory has become increasingly used within electronic equipment as a storage medium due to its non-volatility and robustness, among other factors. Flash memory typically stores information in an array of floating gate transistors called "cells", each of which traditionally stores one bit of information. However, one characteristic that is of particular importance in the design and process development of flash memory is its endurance, or how long a flash memory cell can function in normal operation. For example, the endurance of a flash memory cell may be characterized by the maximum Program/Erase (P/E) cycles through which a memory cell state can undergo and still be read out correctly. As flash memory cell content is altered with high-voltage program and erase commands, the tunnel oxide present between the split gates is gradually degraded through the Program/Erase cycles. The result is that the two states of the cell ("Programmed and "Erase") become harder to distinguish as the read window is gradually narrowed.

One common method of improving the endurance of a flash memory cell is to provide better quality oxide through continued process improvement during the initial manufacture of the flash memory device. However, an alternative method of improving the endurance of a flash memory cell would be to modify the design of the flash memory cell and the Program/Erase mechanism used to write and erase data from the cell.

Figure 1:
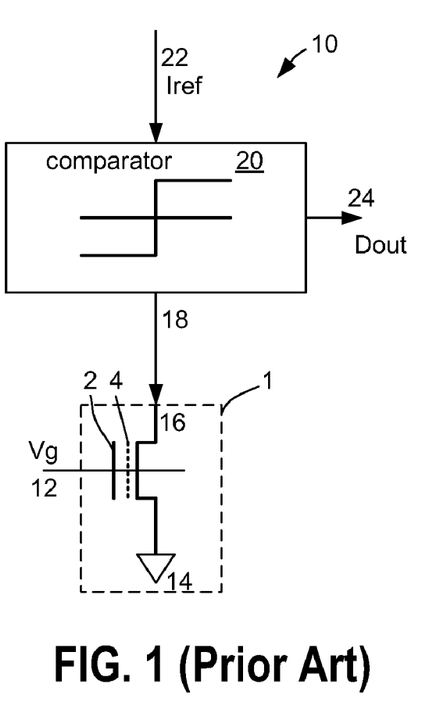
FIG. 1 is a simplified diagram showing the read-out mechanism of a conventional flash memory cell.

Flash memory cells are conventionally designed using a single-cell architecture in, that each bit of data is stored within a single cell. The cell state of the cell which represents that data being stored by the cell is read out as the difference of the word-line voltage and the cell threshold voltage. For example, FIG. 1 is a simplified diagram showing the read-out mechanism of a conventional flash memory cell. Within flash memory system 10, flash memory cell 1 utilizes a split-gate structure in that control gate 2 and floating gate 6 are both utilized. A thin oxide layer 4 separates control gate 2 and floating gate 6 from each other. Source 14 and drain 16 regions are located on sides of the flash memory cell. Gate voltage $V_g$ is input to the flash memory cell through word-line 12. In a conventional method of operation, a positive high voltage is applied to control gate 2 during a Program cycle. This causes electrons to tunnel through the oxide surrounding floating gate 6 and become trapped within thin oxide layer 4. The trapped charges within oxide layer 4 alter the threshold voltage of flash memory cell 1, and the differences within the threshold voltage can be sensed and converted into a binary output. To erase the data stored on memory cell 1 in preparation for reprogramming, a large voltage differential is created between floating gate 6 and control gate 2, and the electrons are removed from oxide layer 4.

Flash memory system 10 further includes comparator 20, which is connected to flash memory cell 1 though bit line 18. Comparator 20 receives a reference level 22 and an output through bit line 18 to output the value being stored within flash memory cell 10 as a digital output 24. The output being received through bit line 18 may be electrical current depending on the threshold voltage $V_t$ of the cell, which is controlled by the number of electrons present in the oxide layer 4 near the floating gate.

However, variations in the threshold voltage may occur across the memory array due to the spatial distribution of cells across the flash memory device. A variation of more than 400 mV in both the programmed state and erased state may occur, even when adjacent cells have very small variations in the threshold voltage $V_t$. As a result, a wider range of voltages may be necessary to further distinguish the voltages used to program a "0" and a "1" within the array of flash memory cells. A word line voltage of about 500 mV above the threshold voltage for an erased cell and about 500 mV below the threshold voltage for a programmed cell is typically required. To properly differentiate between the two states ("1" and "0") the threshold voltage of both states should be separated by at least 1000 mV to clearly recognize the "on" & "off" states. When the voltage window between the erased and programmed cell become less than the minimum window, the sensing circuit will fail.

Figure 2:
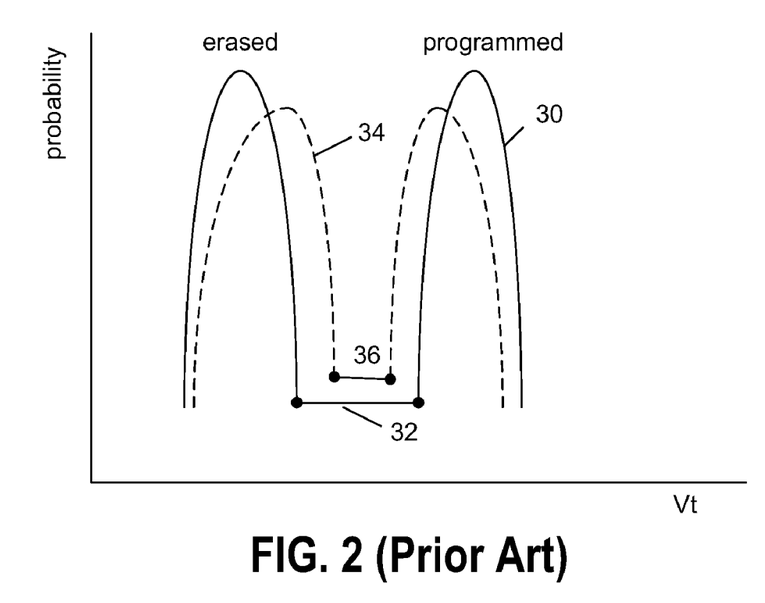
FIG. 2 is an exemplary diagram showing the $V_T$ distribution of cell erased and programmed states for a conventional flash memory cell.

FIG. 2 is an exemplary diagram showing the $V_t$ distribution of cell erased and programmed states for a conventional flash memory cell. The $V_t$ distribution 30 of an exemplary flash memory cell before cycling is shown in comparison to the $V_t$ distribution 34 for same cell following P/E cycling. The voltage $V_t$, at which the flash memory cell saturates, affects how much current passes through the cell and is an important indicator of the contents of the cell. The read window 32 of $V_t$ distribution 30 prior to cycling gradually diminishes to a smaller read window 36 after a certain number of P/E cycles. In addition, $V_t$ distribution 30 gradually shifts to have a lesser probability of a successful program/erase after P/E cycling, as can be seen in $V_t$ distribution 34. As a result, the $V_t$ distribution and drift toward center after P/E cycling are the two major reasons why read difficulties can occur when flash memory is aged and undergoes a large number of P/E cycles.

Figure 3:
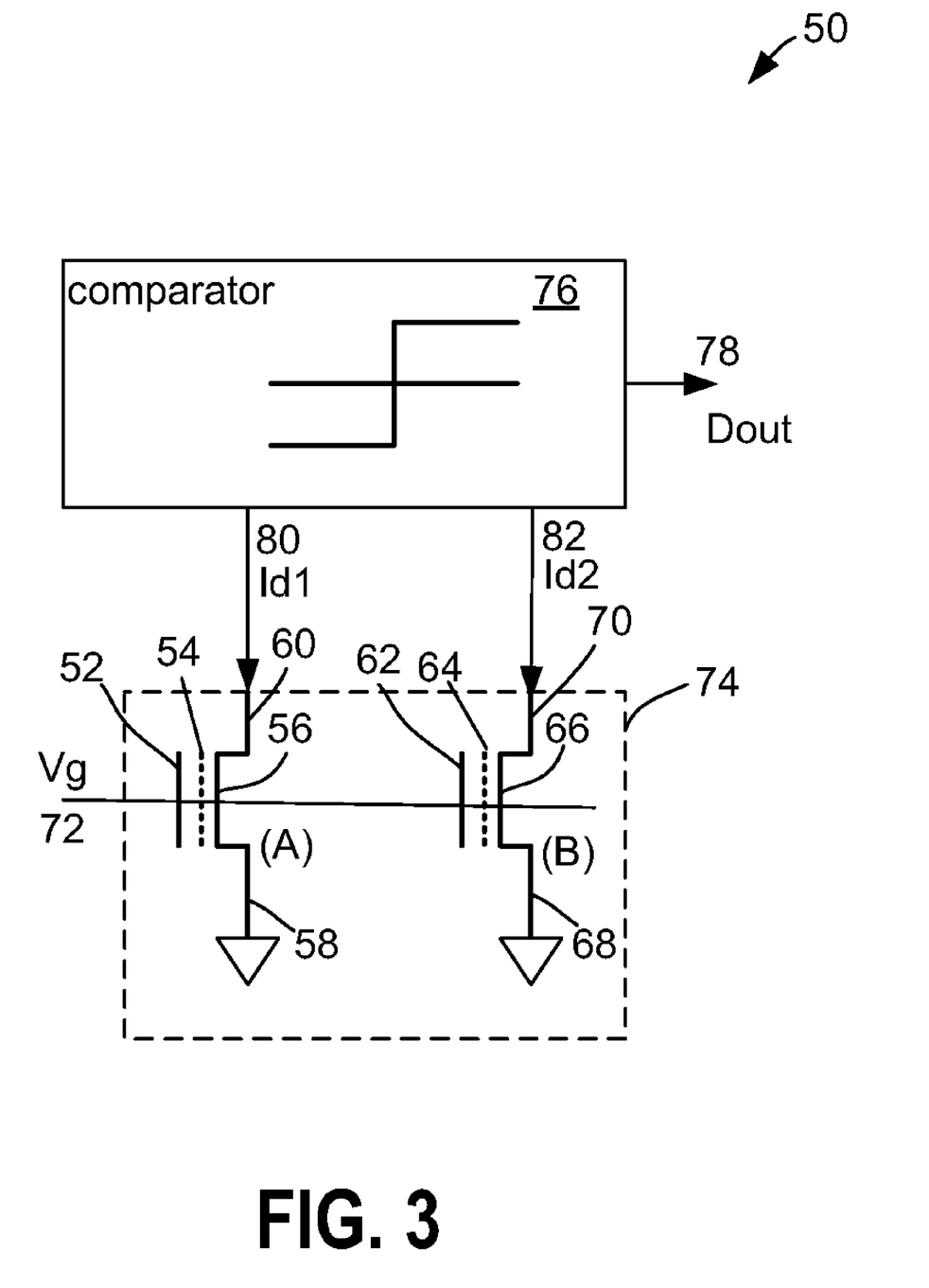
FIG. 3 is a simplified exemplary diagram showing a differential flash memory cell according to an embodiment of the present invention.

FIG. 3 is a simplified exemplary diagram showing a differential flash memory system according to an embodiment of the present invention. This diagram is merely an example, which should not unduly limit the scope of the claims herein. One of ordinary skill in the art would recognize many variations, alternatives, and modifications. Flash memory system 50 includes a comparator 76 and flash memory cells (A) and (B), which may be viewed as a single differential memory cell 74. For example, the flash memory cells (A) and (B) may be complementary to each other. In another example, the flash memory cells (A) and (B) may be identical to each other. In yet another example, the flash memory cells (A) and (B) may be complementary, yet distinct from each other. Similar to FIG. 1, cells (A) and (B) utilize a split-gate structure in that control gates 52, 62 and floating gates 56, 66 are both utilized. A thin oxide layer 54, 64 separates control gate 52, 62 and floating gate 56, 66 from each other. Source regions 58, 68 and drain regions 60, 70 are located on sides of the flash memory cell. Gate voltage $V_g$ is input to both of the flash memory cells through a word-line 72. Flash memory cells (A) and (B) are connected to comparator 76 through bit lines 80, 82. Comparator 76 receives the current from flash memory cells (A) and (B) through bit lines 80, 82 to output the value being stored within flash memory cells (A) and (B) as a digital output Dout 78. While the signal has been described as being transmitted within the current domain, the signal being transmitted through bit lines 80, 82 could be within the voltage domain as well. Of course, there can be other variations, modifications, and alternatives.

Before programming of one of the flash memory cells, both of the cells (A) and (B) are both erased to neutral states. Depending on which state ("0" or "1") should be stored within the flash memory cells (A) and (B), one of them will be programmed to $V_t$. For example, when a "1" should be stored, only (A) is programmed while cell (B) is maintained in an erased state. Conversely, when a "0" should be stored, only (B) is programmed while cell (A) is maintained in an erased state. Of course, there can be other variations, modifications, and alternatives.

In addition to a modified flash memory cell design, flash memory system 50 utilizes a different method to read and store data. In the conventional single-cell design as shown in FIG. 1, the different states are recognized by the difference of the reference level and the cell threshold voltage level $V_t$ after programming/erasing. The reference level must be set to allow for the lowest $V_t$ of programmed cell and the highest $V_t$ of the erased cell to be read. In addition, the reference level itself may have an amount of variation inherent within its values. Due to both of these factors, a very conservative margin must be used for proper functioning. As a typical example, the read window which combines the margin for both programmed and erased states should be at least 1000 mV to allow for correct reading of cell contents. In comparison, within the differential cell design, the programmed and erased states are distinguished by the threshold voltage difference between the two cells only, and any reliance upon an external reference level is removed. Furthermore, the readout circuit (not shown) does not need to account for variations within the $V_t$ distribution of many cells by allowing for a margin. By using comparator 76, a difference of 100 mV can be easily detected which allows for a reduction in the size of the read window to 100 mV level while still allowing flash memory system 50 to read correctly. As a result of the lowered workable read window from 1000 mV to 100 mV, the number of allowable programmed/erased (P/E) cycles and endurance of the cell is greatly increased. Of course, there can be other variations, modifications, and alternatives.

Figure 4:
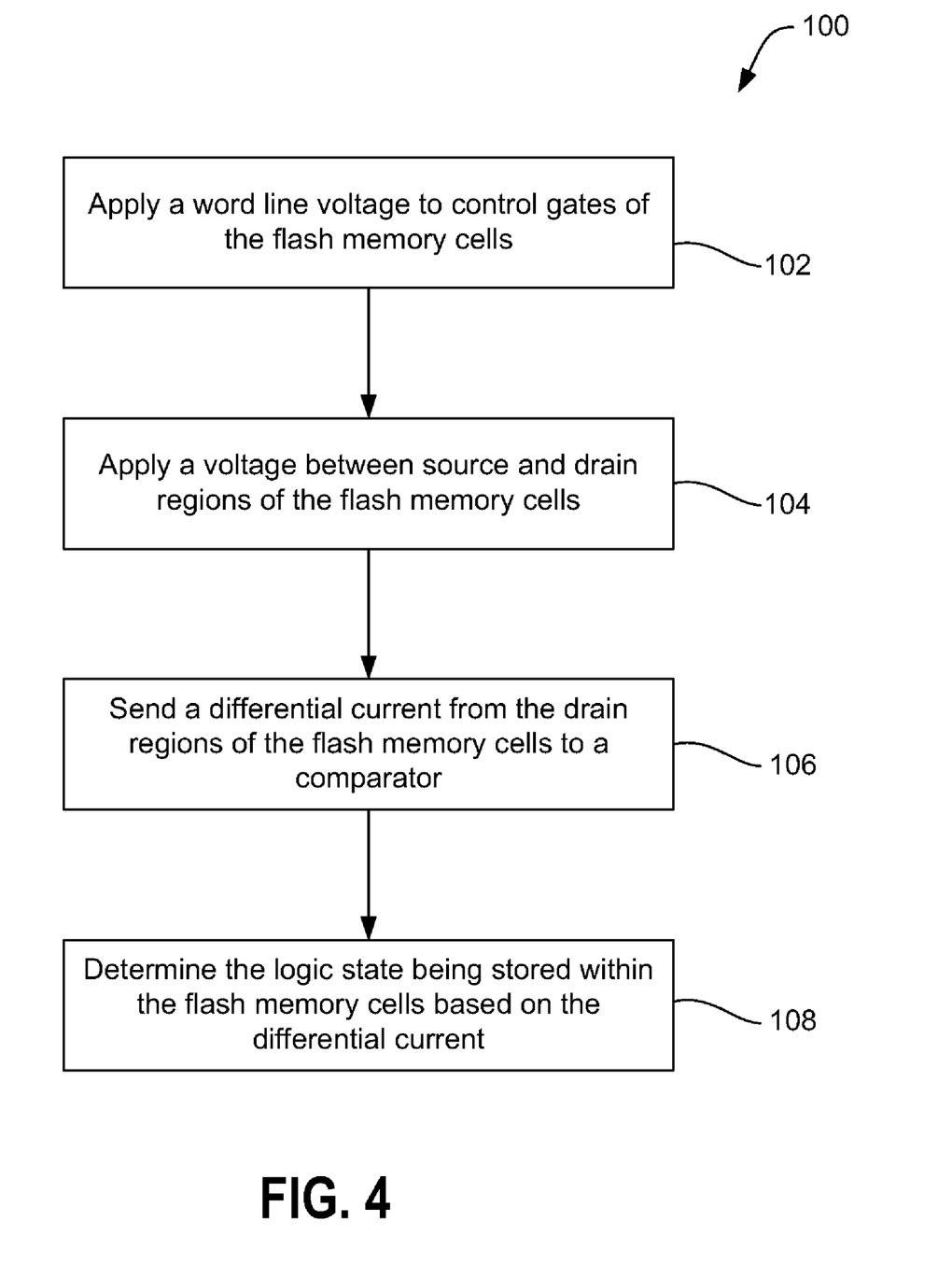
FIG. 4 is a simplified exemplary process flow of a programming mechanism used for a differential flash memory cell according to an embodiment of the present invention.

FIG. 4 is a simplified exemplary process flow of a read mechanism used for a differential flash memory system according to an embodiment of the present invention. Process flow 100 includes process 102 for applying the word line voltage to control gates of the flash memory cells, process 104 for applying a voltage between source and drain regions of the flash memory cells, process 106 for sending a differential current from the drain regions of the flash memory cells to a comparator, and process 108 for determining the logic state being stored within the flash memory cells based on the differential current. This figure is merely an example which should not unduly limit the scope of the claims. One of ordinary skill in the art would recognize many variations, alternatives, and modifications.

To read the logic state being stored within the differential flash memory cell, a voltage is first applied to the control gates of the flash memory cells in process 102. For example, the voltage applied may be greater than the threshold voltage of an unprogrammed cell, but less than the threshold voltage of a programmed cell. As the flash memory cells are both connected to the same word line 72, the gate voltage being applied may be the same to both of flash memory cells (A) and (B). A second voltage is then applied between the source and drain regions of flash memory cells (A) and (B) in process 104. Depending on whether flash memory cells (A) or (B) have been programmed to a logic state, the amount of current passing across the flash memory cells may change. The second voltage being applied between the source and drain regions of flash memory cells (A) and (B) may or may not be the same between the cells (A) and (B). The resulting currents from both flash memory cells (A) and (B) are sent to from the drain regions of the flash memory cells through bit lines 80, 82 to comparator 76. Comparator 76 serves to detect the difference in current between the two cells and determine the logic state being stored within the flash memory cells in process 108. The difference may be detected by first processing information associated with the first current and the second current, and determining a logic state associated with the first flash memory cell and the second flash memory cell based on at least information related to the first current and the second current. For example, the difference in the current can be easily detected as only one of the cells should be programmed at any given time. Of course, there can be other variations, modifications, and alternatives.

Figure 5:
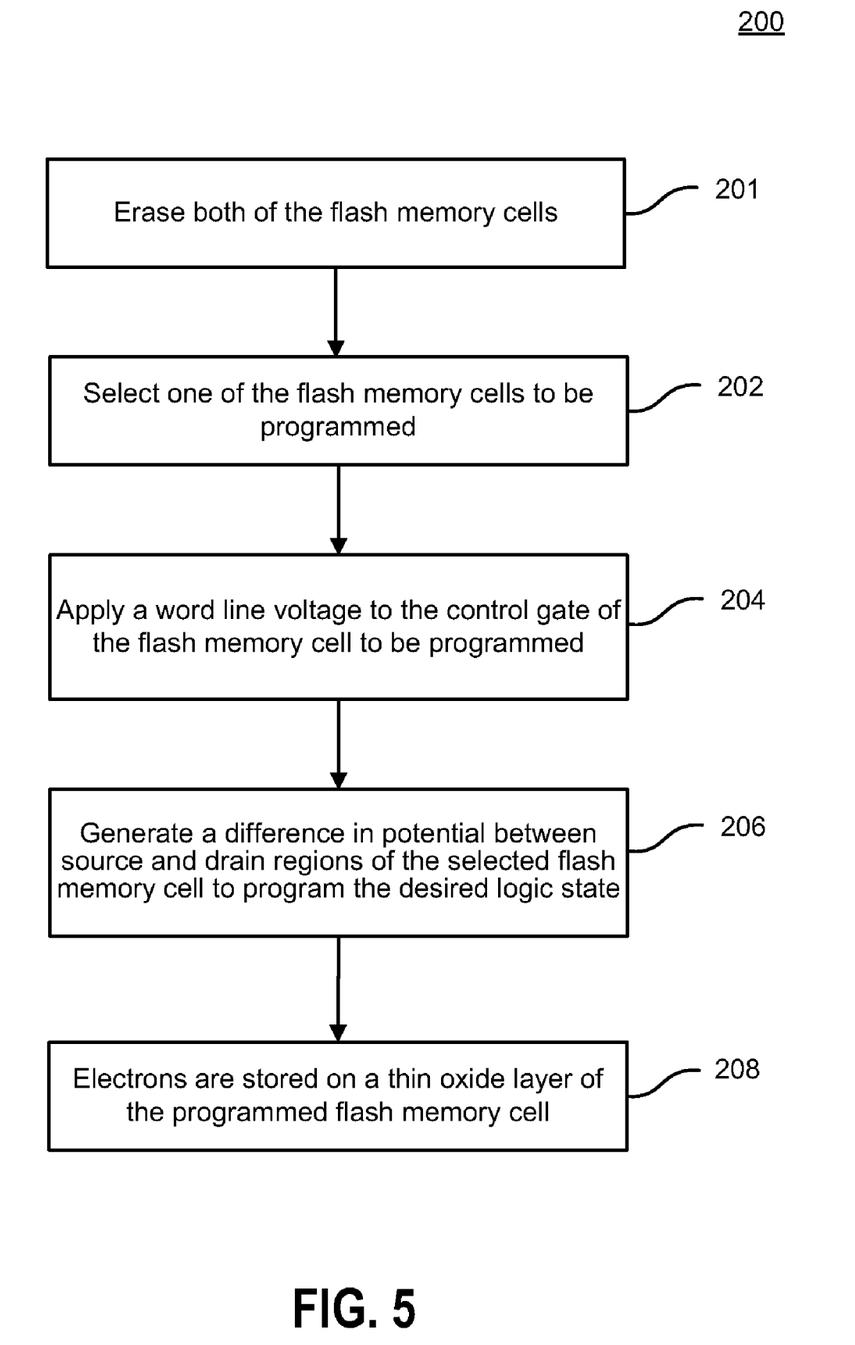
FIG. 5 is a simplified exemplary process flow of the read mechanism used for differential flash memory cell according to an embodiment of the present invention.

FIG. 5 is a simplified exemplary process flow of a programming mechanism used for a differential flash memory system according to an embodiment of the present invention. Process flow 200 includes process 201 for erasing both of the flash memory cells, process 202 for selecting one of the flash memory cells to be programmed, process 204 for applying a word line voltage to the control gate of the flash memory cell to be programmed, process 206 for creating a difference in potential between source and drain regions of the flash memory cell to be programmed, and process 208 for storing electrons on the floating gate of the programmed flash memory cell. This figure is merely an example which should not unduly limit the scope of the claims. One of ordinary skill in the art would recognize many variations, alternatives, and modifications.

In process 201, both of the flash memory cells are erased. This is performed prior to the programming of the cells. In process 202, one of the flash memory cells is selected to be programmed, depending on the logic state desired. The selection of which of the flash memory cells is to be programmed is dependent upon the specific implementation used. In process 204, a word line voltage is applied to the control gate of the cell selected in process 202. A difference in potential is then generated between the source and drain regions of the flash memory cell to be programmed in process 206. If provided with enough energy, the electrons may 'jump' over the oxide region into floating gate to be stored within the thin oxide layer separating the floating gate from the control gate. As a result, the electrons can become stored within the oxide layer between the control gate and the floating gate, resulting in an increase in the threshold voltage of the programmed flash memory cell. The change in the threshold voltage of the cell created by the stored electrons causes the cell to become programmed. For example, a first logic state may be associated with both of the flash memory cells. For example, if the selected flash memory cell is a first flash memory cell that is programmed during this process, the logic state of the flash memory system may be at a first logic state. If the selected memory cell is the second flash memory cell that is programmed during this process, the logic state of the flash memory system may be at a second logic state. In a specific embodiment, the two logic states being represented within the flash memory system may be represented by having one of the cells selected for programming while the other is not programmed. For example, the first logic state may be represented by having the first flash memory cell programmed while the second flash memory cell is left at a lower threshold value, and a second logic state may be represented by having the second flash memory cell programmed while the first flash memory cell is left at a lower threshold value. Of course, there can be other variations, modifications, and alternatives.

In another embodiment of the present invention, the read voltage may be optimally selected so that one or more of the flash memory cells (A) and (B) are turned on, but not high enough so that programming of the erased cells would occur. For example, the read voltage can now be set to accommodate two parameters: increased read speed or reduced power consumption. For example, when an increased read speed is required, the read voltage can be increased to make reading from the differential memory cell occur faster. Conversely, when power consumption is a priority but read speed is not as much of a factor, the read voltage can be reduced. Of course, there can be other variations, modifications, and alternatives.

In another embodiment of the present invention, the read current may be selected so that one or more of the memory cells (A) and (B) are turned on, but not at a read current value where programming of the erased cells would occur. For example, during the programming process, a differential current may generated to drive the read-out circuit. The differential current can influence the read speed of the flash memory cell structure. By monitoring the differential current during the programming process and comparing it against the demanded current for programming, greater optimizations can be made to the power consumption and read speed of the circuit. For example, the read current can now be set to accommodate two parameters: increased read speed or reduced power consumption. For example, when an increased read speed is required, the read current can be increased to make reading from the differential memory cell occur at a faster rate. In addition, internal voltage stresses within the differential memory cell can be reduced by reducing the read period of the device. Conversely, when power consumption is a priority but read speed is not as much of a factor, the read voltage can be reduced while still yielding a reduced programming time. Of course, there can be other variations, modifications, and alternatives.

Figure 6:
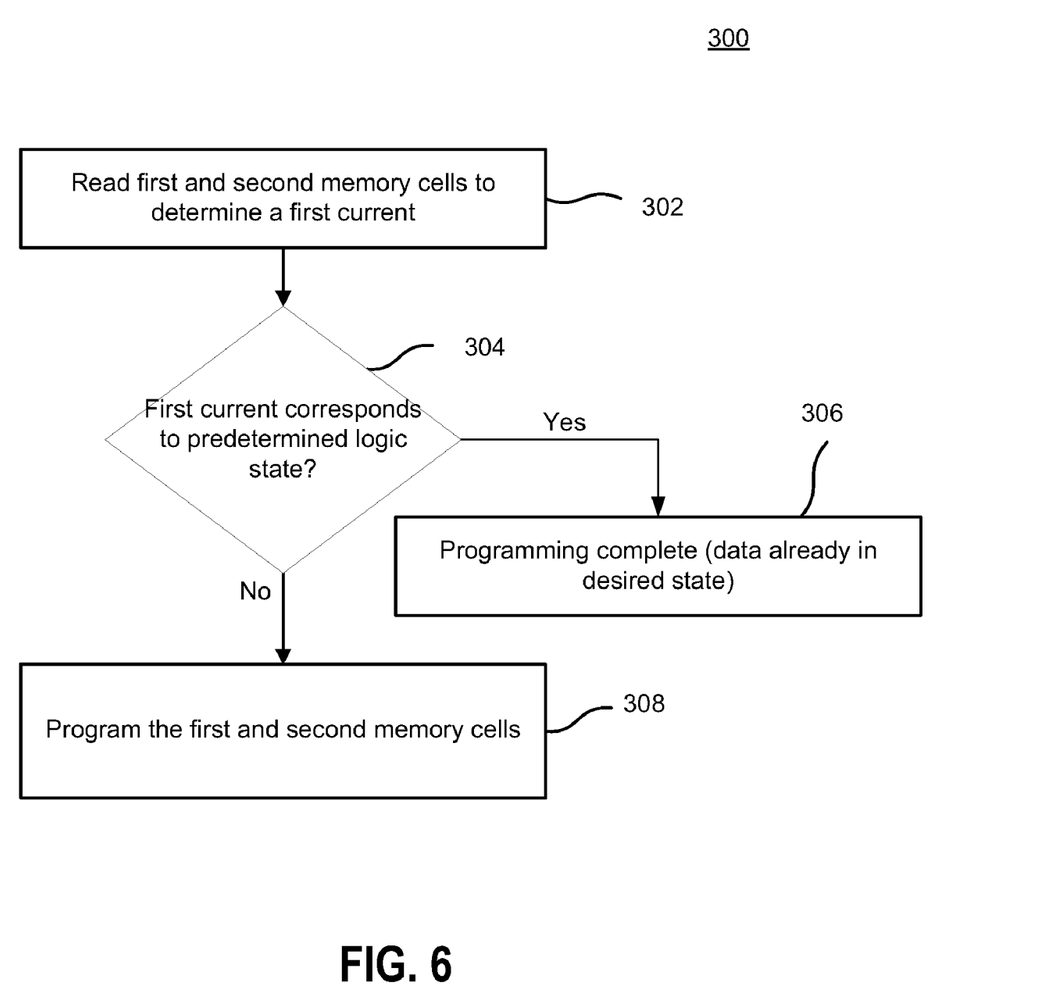
FIG. 6 is a simplified exemplary process flow of a programming mechanism used for a flash memory system according to an embodiment of the present invention.

FIG. 6 is a simplified exemplary process flow of a programming mechanism used for a flash memory system according to an embodiment of the present invention. Process flow 300 includes process 302 for reading a first and second memory cell to determine a first current, process 304 for determining if the first current corresponds to a predetermined logic state, process 306 for completing programming when the data is already in the desired logic state, and process 308 for programming the first and second memory cell. Other alternatives can also be provided where processes are added, one or more processes are removed, or one or more processes are provided in a different sequence without departing from the scope of the claims herein. Future details of the present invention can be found throughout the present specification and more particularly below.

In process 302, the first and second memory cells are read to determine a first current. For example, the read process may be implemented in a flash memory system having first and second memory cells. The first memory cell may include a first transistor associated with a first threshold voltage, and the second memory cell may include a second transistor associated with a second threshold voltage. The first current is associated with at least the first and second threshold voltages. For example, the read process may be performed by applying a word-line voltage to both of the cells and comparing the output current using a comparator to determine the difference between the cells. The output of the comparator may be a differential current. A reliance upon a reference level used across the array of memory cells can be removed, as the states stored within the memory cells are no longer recognized by the difference between the reference level and the cell $V_T$. Of course, there can be other variations, modifications, and alternatives.

In process 304, a check is performed to determine if the first current corresponds to a predetermined logic state. For example, the predetermined logic state may be a logic "0" or "1" value that is to be stored within the flash memory system. If the first current corresponds to the predetermined logic state, then programming is complete as process 306 in that the data is already within a desired state. No further actions need to be performed. By checking the contents of the memory cells prior to programming, potential power savings can be achieved due to the reduced amounts of current that needs to be applied to the memory cells as further programming is not required. Of course, the programming mechanism could also be performed by programming the memory cells without first reading its contents. Of course, there can be other variations, modifications, and alternatives.

In process 308, the first and second memory cells are programmed, as the first current does not correspond to the predetermined logic state. The programming process may include changing the threshold values of the first and second memory cells to different values from their original values. For example, the first threshold voltage may be changed to a third value, and the second threshold voltage may be changed to a fourth value. In a specific embodiment, the second and third values may be substantially the same. The programming of the first and second memory cells may also comprise erasing one of the two memory cells by creating a large voltage differential between the floating gate and the control gate, allowing the electrons trapped within the oxide layer to be removed. Of course, there can be other variations, modifications, and alternatives.

Following the changing of the threshold values of the first and second memory cells, the first memory cell and second memory cell may be read to determine a second current associated with at least the first and second threshold voltages. In this manner, a 'break' may be present during the programming process while the first and second memory cells are read. For example, after the changing of the threshold voltages within the first and second memory cells, the amount of those changes can be assessed by reading the first and second memory cells. If the second current determined from reading the first and second memory cells and comparing the values satisfies a predetermined relation with respect to a predetermined current, then the programming process is complete. For example, the second current may be a differential current determined by comparing the values obtained from reading the first and second memory cells. In another example, the second current can be used to drive the readout circuit. If the second current does not satisfy the predetermined relation with respect to the predetermined current, then the second threshold voltage may be adjusted to a different value. Continued read/programming processes may be performed in an iterative manner until the second threshold voltage fulfils the predetermined relation with respect to the predetermined current. Of course, there can be other variations, modifications, and alternatives.

In a specific embodiment of the present invention, the predetermined current may be a demanded current $I_R$ which is adjustable according to the read speed requirement. For example, in a conventional implementation, programming is performed 'blind' without regard to matching the demanded current, resulting in a potentially longer programming time and additional stress to the circuit. For example, the first and second currents may be differential currents which to a large degree determine the read speed of the flash memory system. By providing an adjustable demanded current $I_R$, the demanded current may be set in accordance with desired performance parameters such as read speed or low-power usage. The demanded current may also be determined outside of the flash memory system. Of course, there can be other variations, modifications, and alternatives.

In another embodiment of the present invention, the differential current between the two memory cells may be monitored during the programming process and compared against the predetermined current. Once the demanded current is reached, the programming of the cell is complete. By monitoring the differential voltage during programming, the programming time and the amount of high-voltage stress applied to the circuit can be reduced. Additionally, when power consumption is a priority but read speed is not as much of a factor, the read voltage can be reduced while still yielding a reduced programming time. Of course, there can be other variations, modifications, and alternatives.

Figure 7:
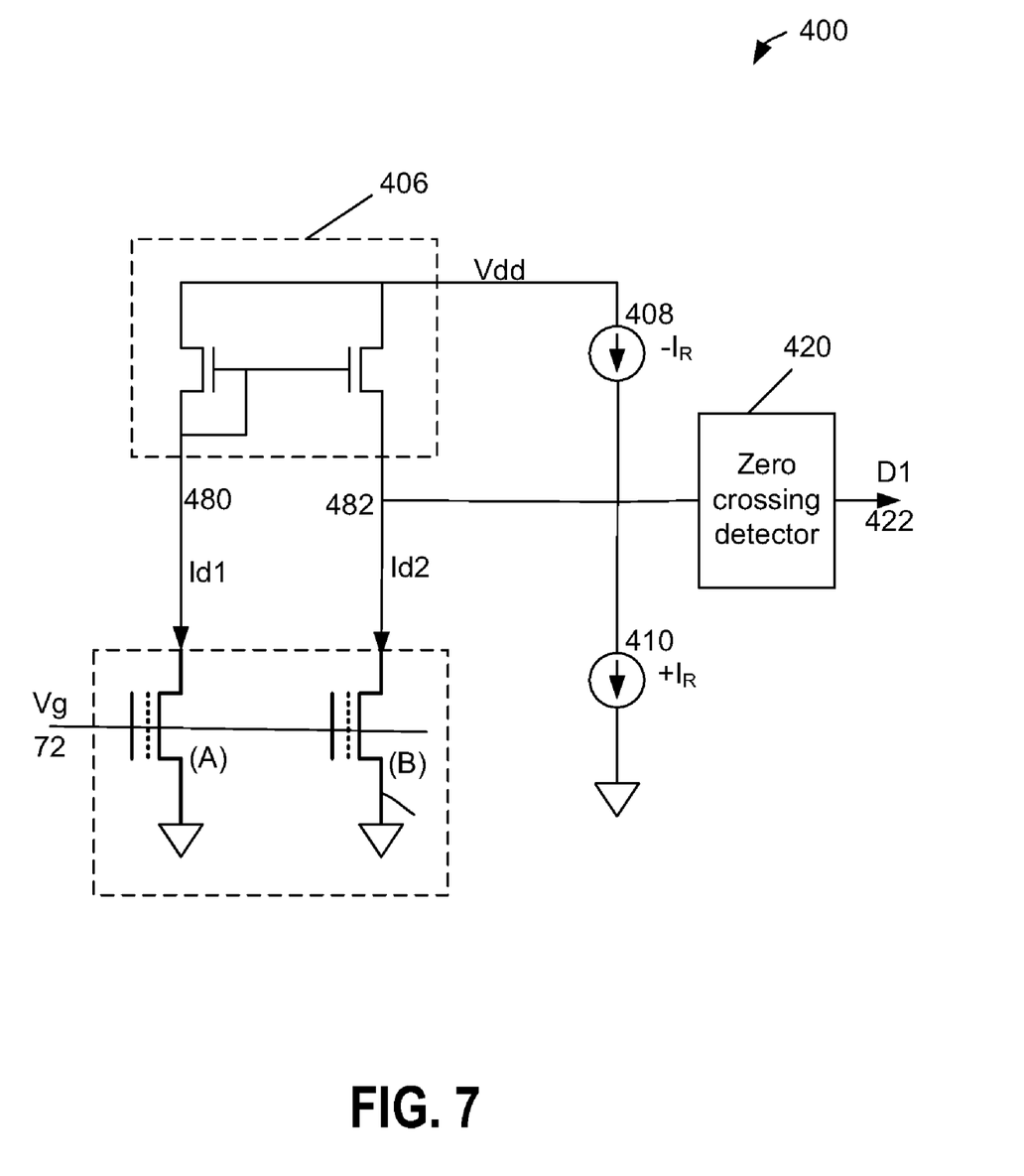
FIG. 7 is a simplified exemplary diagram showing a flash memory system according to an embodiment of the present invention.

FIG. 7 is a simplified exemplary diagram showing a flash memory system according to an embodiment of the present invention. These diagrams are merely examples, which should not unduly limit the scope of the claims herein. While an exemplary flash memory cell is shown in FIG. 7, one of ordinary skill in the art would recognize many variations, alternatives, and modifications. For example, the process flow described in FIG. 6 may be implemented within the exemplary differential flash memory cell shown in FIG. 7, but could also be implemented within other differential flash memory cell designs as well.

Flash memory system 400 includes comparator 406 and memory cells (A) and (B). For example, the memory cells (A) and (B) may also be identical to each other. In another example, memory cells (A) and (B) may be similar or utilize a split-gate structure similar to the cells described in regards to FIGS. 1 and 3. Memory cells (A) and (B) are coupled to comparator 406 through bit lines 480, 482. Comparator 406 may comprise two MOS transistors coupled together in a current mirror or current subtractor configuration, and is used to determine the difference between the two inputs and detect which current of memory cell (A) or (B) is larger. The memory cells (A) and (B) may also be transistors or EEPROMS according to embodiments of the present invention. Of course, there can be other variations and alternatives.

A current source $I_R$ is coupled at the output of the comparator, either from the top side 408 ($-I_R$) or from the down side 410 ($+I_R$). Of course, two separate current sources could also be used in place of current source $I_R$. In addition, two switches 412 and 414 are respectively coupled to both sides of the current source to determine which side of the current source will be applied during a programming process. For example, when current ID1 is less than current ID2, a negative current ($-I_R$) may be applied to offset ID1. Alternatively, when ID1 is greater than ID2, a positive current ($+I_R$) may be applied to offset $I_{D1}$. The direction of the reference current depends upon which of the memory cells (A) or (B) is to be programmed.

A zero-crossing detector 420 is coupled in between the switches to determine a relationship between the differential current and the predetermined current. For example, the relationship may be when the differential current has reached a demanded level ($I_R$). Once that has occurred, the zero-crossing detector is triggered and an output D1 (422) is sent from the flash memory system, indicating that the programming process is over.

In another embodiment of the invention, flash memory system 400 may be controlled by a state machine which determines the read/write/program cycle of the memory cell.

The use of a differential cell structure and related program/read method can serve to greatly alleviate the endurance issue for flash memory devices. By utilizing embodiments of the present invention, the effect of shifting $V_t$ distributions is removed and the read window can be as small as tens of millivolts when performing a read process with the differential flash memory cell. As a result, the lifetime of differential flash memory devices can be greatly increased. An additional benefit is that the word-line voltage can be adjusted depending upon application-sensitive needs, making it possible to optimize for high readout speed or lower power consumption.

It is to be understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of programming a flash memory system including a first memory cell and a second memory cell, the first memory cell including a first transistor associated with a first threshold voltage, the second memory cell including a second transistor associated with a second threshold voltage, the method comprising:

reading the first memory cell and the second memory cell to determine a first current associated with at least the first threshold voltage and the second threshold voltage, the first threshold voltage being equal to a first value, the second threshold voltage being equal to a second value;

determining if the first current corresponds to a predetermined logic state;

if the first current does not correspond to the predetermined logic state, programming the first memory cell and the second memory cell, wherein the programming the first memory cell and the second memory cell includes:

changing the first threshold voltage from the first value to a third value;

changing the second threshold voltage from the second value to a fourth value;

reading the first memory cell and the second memory cell to determine a second current associated with at least the first threshold voltage and the second threshold voltage;

determining whether the second current satisfies a predetermined relation with respect to a predetermined current; and if the second current does not satisfy the predetermined relation with respect to the predetermined current, changing the second threshold voltage from a fourth value to a fifth value.

2. The method of claim 1 wherein the first memory cell comprises:

a first control gate, the first control gate connected to a first word line;

a first floating gate;

a first oxide layer separating the first control gate from the first floating gate;

a first source region; and a first drain region, the first drain region connected to a first bit line;

and the second memory cell comprises:

a second control gate, the second control gate connected to the first word line;

a second floating gate;

a second oxide layer separating the second control gate from the second floating gate;

a second source region; and a second drain region, the second drain region connected to a second bit line.

3. The method of claim 1 wherein the transistors are EEPROMs.

4. The method of claim 1 wherein the third value is substantially the same as the second value.

5. The method of claim 1 wherein the predetermined relation is greater than a relation between the second current and the predetermined current.

6. The method of claim 1 wherein programming of the second memory cell is stopped when the predetermined relation is satisfied.

7. The method of claim 1 wherein if the first current corresponds to a predetermined logic state, no further action is performed.

8. The method of claim 1 wherein the predetermined programming state represents either a logic '0' or a logic '1'.

9. The method of claim 8 wherein the predetermined programming state consists of one of the first and second memory cells at a high threshold level and the other at a low threshold level.

10. The method of claim 1 wherein the predetermined current is determined outside of the flash memory system.

11. The method of claim 1 wherein the predetermined current can be set according to desired performance parameters.

12. The method of claim 11 wherein the predetermined current is set for reduced power consumption of the flash memory system.

13. The method of claim 11 wherein the predetermined current is set for increased read speed of the flash memory system.

14. A flash memory system comprising:

a first flash memory cell;

a second flash memory cell;

a comparator configured to receive a first current from the first flash memory cell;

receive a second current from the second flash memory cell;

process information associated with the first current and the second current; and determine a differential current equal to a difference between the first current and the second current;

a current supply configured to provide a predetermined current;

a detector configured to determine a relation between the differential current and the predetermined current.

15. The flash memory system of claim 14 wherein the current supply comprises a first current source coupled to a first switch, and a second current source coupled to a second switch.

16. The flash memory system of claim 15 wherein only one of the first switch or the second switch is closed at any time.

17. The flash memory system of claim 14 wherein the detector is a zero crossing detector further configured to determine when the differential current reaches the predetermined current.

18. The flash memory system of claim 17 wherein the zero crossing detector is further configured to send an output signal from the flash memory system.

19. The flash memory system of claim 14 wherein the comparator is implemented as a current mirror.

20. The flash memory system of claim 14 wherein the first memory cell is at a high threshold level and the second memory cell is at a low threshold level.

* * * * *